United States Patent

Hsia

[11] Patent Number: 6,130,573
[45] Date of Patent: Oct. 10, 2000

[54] VOLTAGE BOOSTING CIRCUIT HAVING ASYMMETRIC MOS IN DRAM

[75] Inventor: Liang-Choo Hsia, Hsinchu Hsien, Taiwan

[73] Assignee: United Integrated Circuits Corp., Shinchu, Taiwan

[21] Appl. No.: 09/313,518

[22] Filed: May 17, 1999

[51] Int. Cl.[7] .................................. G05F 1/10; G05F 3/02
[52] U.S. Cl. .............................................. 327/536; 327/390
[58] Field of Search ...................................... 327/333, 390, 327/534, 535, 536, 537; 326/68; 365/189.11

[56] References Cited

U.S. PATENT DOCUMENTS 4,805,152  2/1989  Kogan ....................................... 365/222
5,783,962  7/1998  Rieger ....................................... 327/390

Primary Examiner—Terry D. Cunningham
Assistant Examiner—Anh-Quan Tra
Attorney, Agent, or Firm—Jiawei Huang; J.C. Patents

[57] ABSTRACT

A voltage boosting circuit having an asymmetric MOS in DRAM. A gate of a first NMOS connects to a voltage source, and a source region of the first NMOS connects to a row decoder. A gate of the asymmetric NMOS connects to a drain region of the first NMOS. A drain region of the asymmetric NMOS connects to a column decoder, and a source region of the first asymmetric NMOS connects to a word line. A gate of a second NMOS connects to the column decoder, a source region of the second NMOS connects to a ground terminal and a drain region of the second NMOS connects to a source region of the first asymmetric NMOS.

5 Claims, 3 Drawing Sheets

VOLTAGE BOOSTING CIRCUIT HAVING ASYMMETRIC MOS IN DRAM

BACKGROUND OF THE INVENTION

1. Field of the Invention

The present invention relates to a voltage boosting circuit in dynamic random access memory (DRAM). More particularly, the present invention relates to a voltage boosting circuit having an asymmetric metal oxide semiconductor (MOS) in DRAM.

2. Description of the Related Art

A voltage boosting circuit is required to enhance the performance of an integrated circuit that uses a low voltage to reduce power consumption. The voltage boosting circuit generates a voltage higher than the voltage supplied to integrated circuit. For example, in a DRAM, a word line voltage boosting circuit is usually used to generate a voltage signal higher than the voltage supply of the DRAM. The generated voltage is supplied to the word line of a memory to improve the read/write reliability of memory arrays in DRAM.

FIG. 1 is a circuit diagram of a conventional voltage boosting circuit. FIG. 2 is a timing diagram of the voltage boosting circuit shown in FIG. 1.

Referring to FIG. 1, a gate of an N-type MOS (NMOS) 10 connects to a voltage source 18, a source region of the NMOS 10 connects to both a row decoder 22 and a source region of an NMOS 14, and a drain region of the NMOS 10 connects to a gate of an NMOS 12. The row decoder 22 receives an address signal $A_i$ and outputs a decoded word line signal $\phi_s$. A drain region of the NMOS 12 connects to both a column decoder 24 and a gate of the NMOS 14, and a source region of the NMOS 12 connects to a drain region of the NMOS 14, a drain region of an NMOS 16 and a word line (not shown). The column decoder 24 receives an address signal $A_j$, and outputs a word line signal $\phi Xi$ and a complementary word line signal $\overline{\phi Xi}$. The word line signal $\phi Xi$ is a boosting signal and a voltage $V_{pp}$ of the word line signal $\phi Xi$ is higher than a voltage $V_{cc}$ of the voltage source 18. A gate of the NMOS 16 connects to the column decoder 24, and a source region of the NMOS 24 connects to a ground terminal 20.

Referring to FIGS. 1 and 2, the column decoder 24 outputs a word line signal $\phi Xi$ set to Low and a complementary word line signal $\overline{\phi Xi}$ set to High. By the signals, the NMOS 14 is OFF and the NMOS 16 is ON, so that a voltage of a node N3 is equal to a voltage $V_{ss}$ of the ground terminal 20. Then, the row decoder 22 outputs a decoded word line signal $\phi_s$ set to High, wherein a voltage of the decoded word line signal $\phi_s$ is $V_{cc}$. As a result, a voltage of a node N1 is $V_{cc}$, and a voltage of a node N2 is $V_{cc}-V_{th1}$ where $V_{th1}$ is a threshold voltage of the NMOS 10.

The voltage of the word line signal $\phi Xi$ is then set to $V_{pp}$, and the difference between the voltage $V_{pp}$ and the voltage of a node N1 is $V_{th2}$, where $V_{th2}$ is a threshold voltage of the NMOS 12. Based on the above condition, the NMOS 14 is ON and the NMOS 16 is OFF, and thus, a voltage of a node N4 is $V_{pp}$. When the NMOS 14 is ON, the voltage of the node N3 is equal to the voltage of the node N1. As a result, when the node N4 receives the word line signal $\phi Xi$ whose voltage is $V_{pp}$, the voltage of the node N2 is boosted to $V_{cc}-V_{th1}+\alpha V_{pp}$, in which $\alpha$ is a self-boosting ratio.

The design of the voltage boosting circuit described above is complex and assembled from several metal oxide semiconductors. Furthermore, an area occupied by the voltage boosting circuit is large.

SUMMARY OF THE INVENTION

Accordingly, the present invention provides a voltage boosting circuit having an asymmetric MOS in DRAM. The design of the voltage boosting circuit in the invention is simple since less MOS devices are implemented, and an area occupied by the voltage boosting circuit is small.

To achieve these and other advantages and in accordance with the purpose of the invention, as embodied and broadly described herein, the invention provides a voltage boosting circuit having an asymmetric MOS in DRAM. A gate of a first NMOS connects to a voltage source, and a source region of the first NMOS connects to a row decoder. A gate of the asymmetric NMOS connects to a drain region of the first NMOS. A drain region of the asymmetric NMOS connects to a column decoder, and a source region of the first asymmetric NMOS connects to a word line. A gate of a second NMOS connects to the column decoder, a source region of the second NMOS connects to a ground terminal and a drain region of the second NMOS connects to a source region of the first asymmetric NMOS.

The design of the voltage boosting circuit according to the invention is simple, and the voltage boosting circuit is completely assembled from N-type metal oxide semiconductors. Furthermore, the N-type metal oxide semiconductors are fewer in number; thus an area occupied by the voltage boosting circuit is small.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
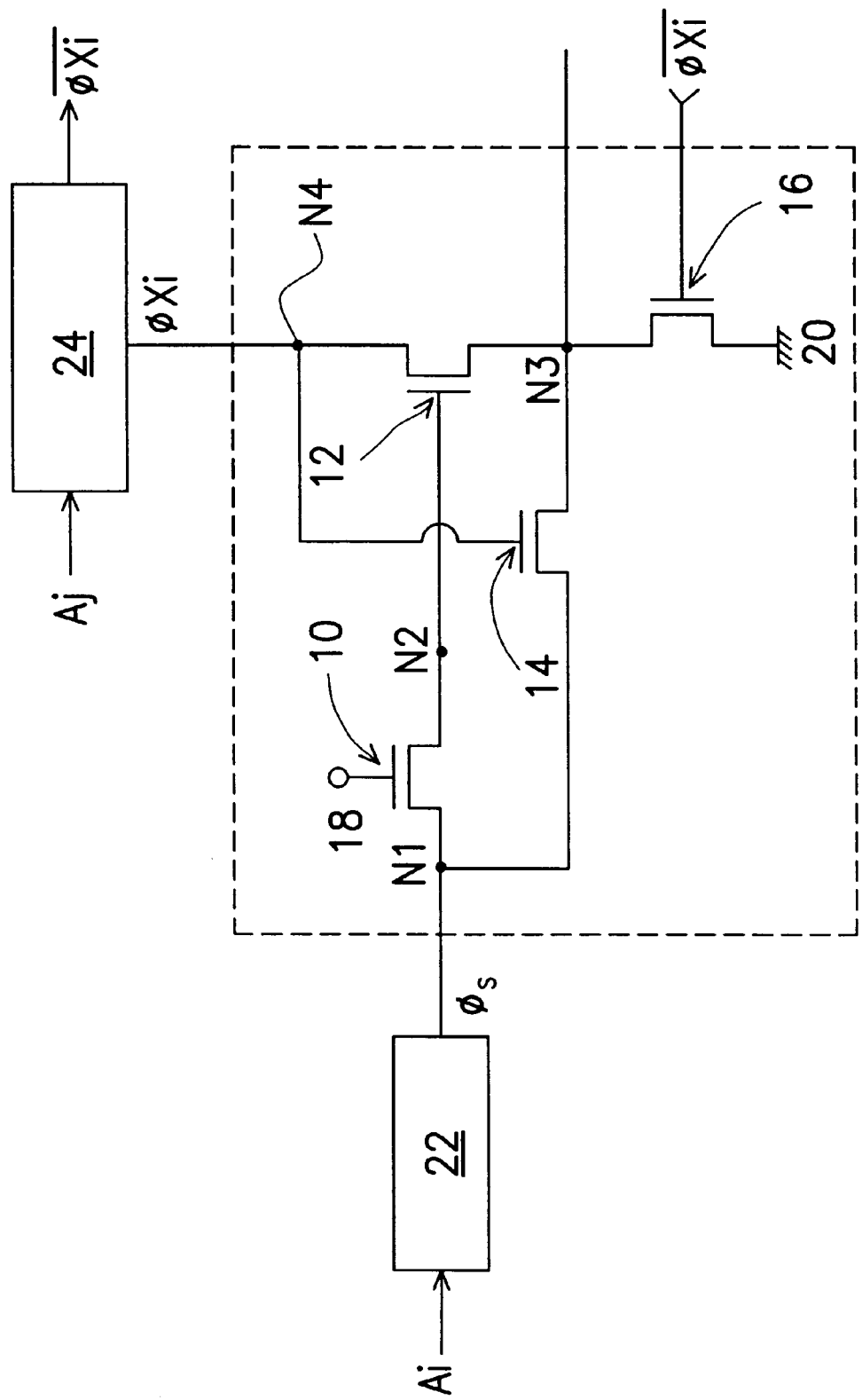
FIG. 1 is a circuit diagram of a conventional voltage boosting circuit.
Figure 2:
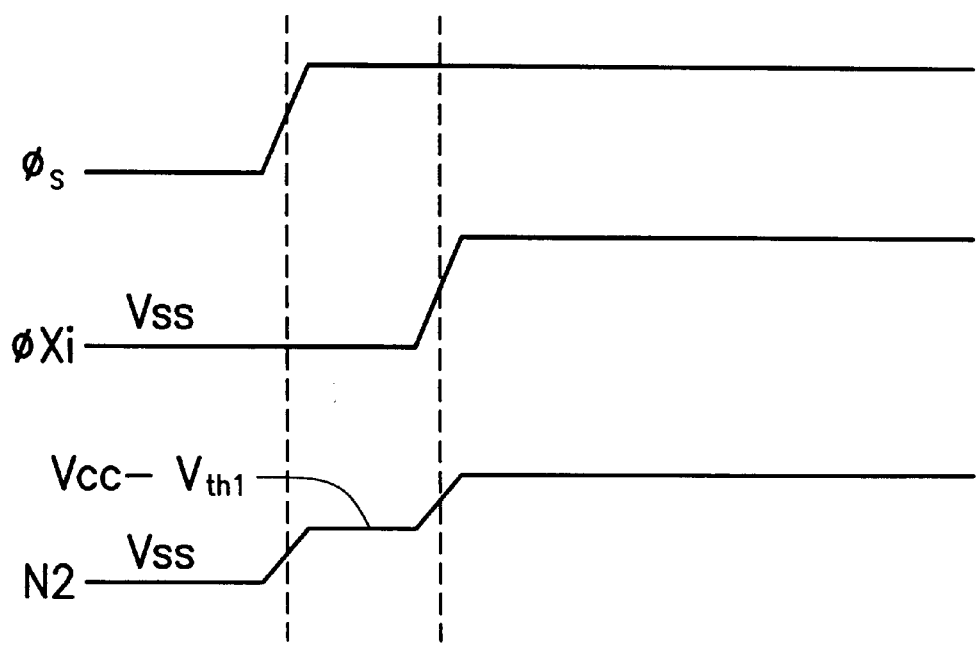
FIG. 2 is a timing diagram of the voltage boosting circuit shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
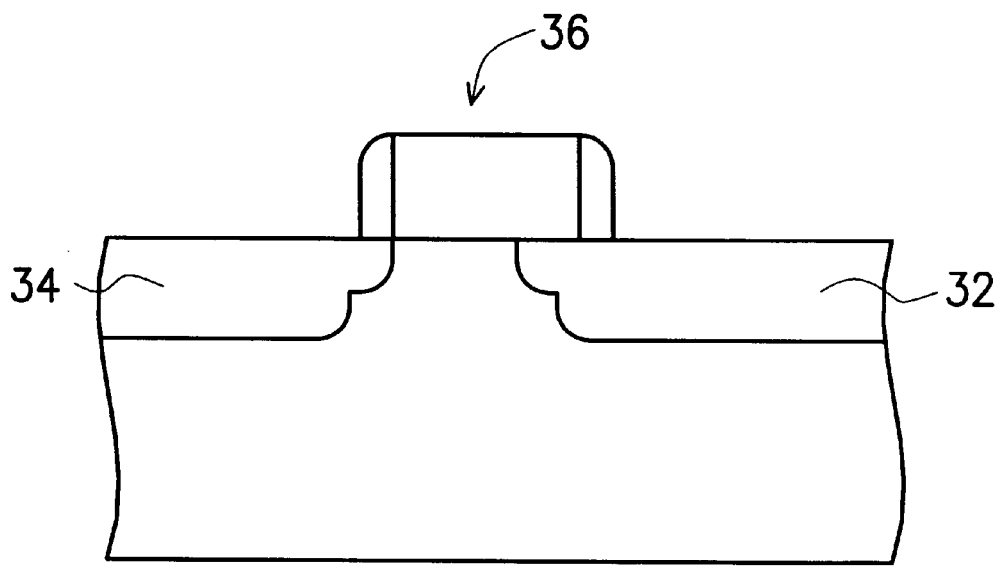
FIG. 3 is a schematic, cross-sectional diagram of an asymmetric MOS according to the invention.

FIG. 3 is a schematic, cross-sectional diagram of an asymmetric MOS according to the invention.

Referring to FIG. 3, an asymmetric NMOS according to the invention is shown. A drain region 32 of the asymmetric NMOS is wider than a source region 34 of the same. Additionally, a portion of the drain region 32 covered by a gate 36 of the asymmetric NMOS is larger in than a portion of the source region 34 covered by the gate 36. The drain region 32 is formed by, for example, tilted ion implantation. Since a sufficient larger portion of the drain region 32 covered by the gate 36, a capacitance $C_{gd}$ between the drain region 32 and the gate 36 is larger than a capacitance $C_{gs}$ between the source region 34 and the gate 36.

Figure 4:
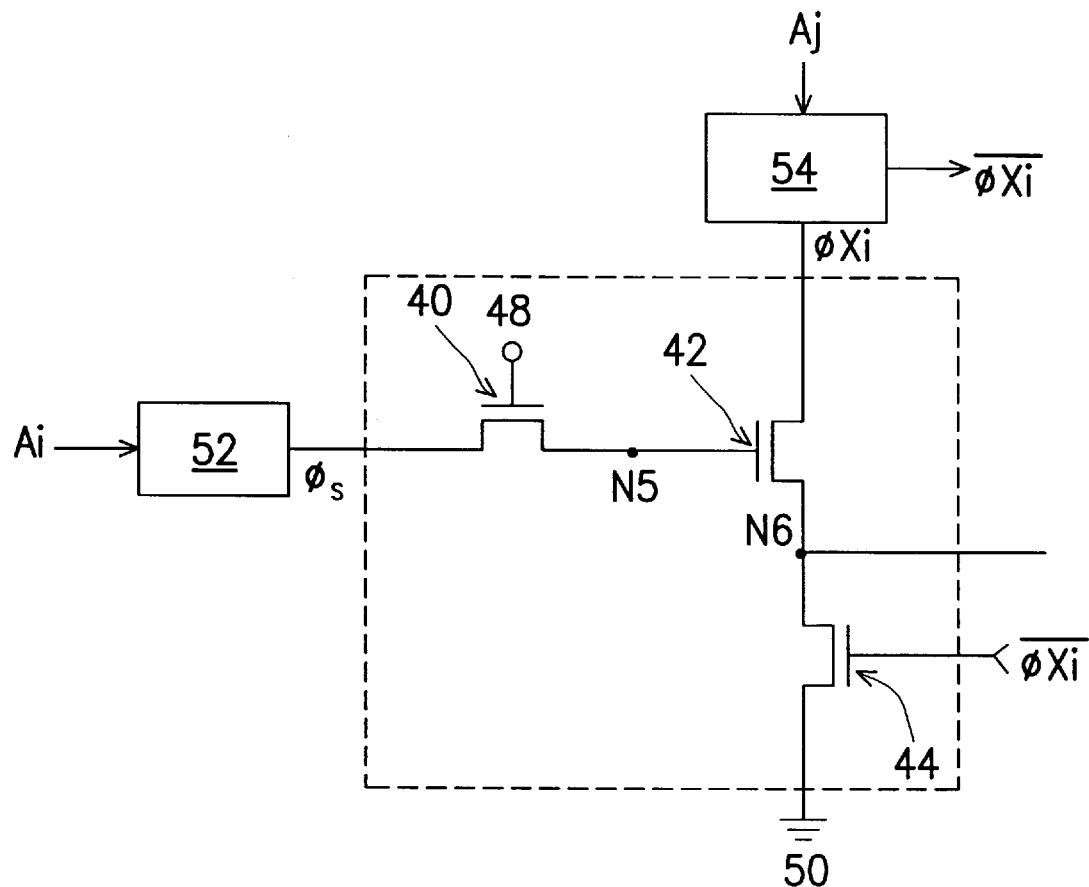
FIG. 4 is a circuit diagram of a voltage boosting circuit having a asymmetric MOS according to the invention.
Figure 5:
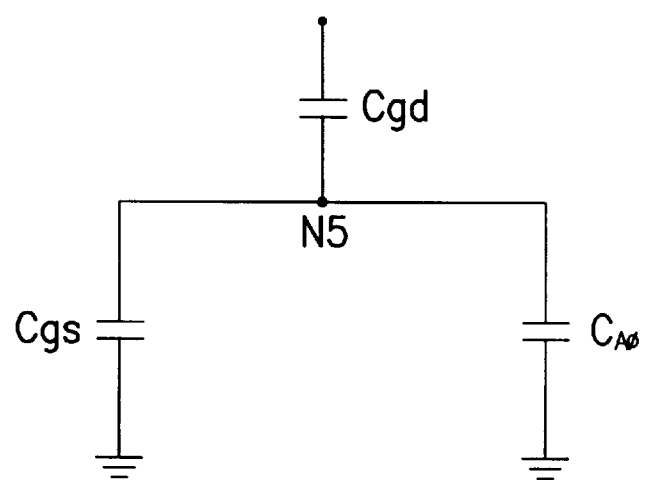
FIG. 5 is an equivalent circuit diagram of the asymmetric MOS shown in FIG. 4.

FIG. 4 is a circuit diagram of a voltage boosting circuit having an asymmetric MOS according to the invention. FIG. 5 is an equivalent circuit diagram of the asymmetric MOS shown in FIG. 4.

Referring to FIG. 4, a gate of an NMOS 40 connects to a voltage source 48, a source region of the NMOS 40 connects to a row decoder 52 and a drain region of the NMOS 40 connects to a gate of an NMOS 42. The row decoder 52 receives an address signal $A_i$ and outputs a decoded word line signal $\phi_s$. A drain region of the NMOS 42 connects to a column decoder 54, and a source region of the NMOS 42 connects to a drain region of an NMOS 44 and a word line (not shown). The column decoder 54 receives an address signal $A_j$ and outputs a word line signal $\phi Xi$ and a complementary word line signal $\overline{\phi Xi}$. A gate of the NMOS 44 connects to the column decoder 54 and a source region of the NMOS 44 connects to a ground terminal 50. The NMOS 42 is an asymmetric NMOS according to the invention as shown in FIG. 3.

Referring to FIGS. 4 and 5, a procedure for operating the voltage boosting circuit is described. The column decoder 54 outputs a word line signal $\phi Xi$ set to Low and a complementary word line signal $\overline{\phi Xi}$ set to High. By the signals, the NMOS 42 is OFF and the NMOS 44 is ON, so that a voltage of a node N6 is equal to a voltage $V_{ss}$ of the ground terminal 50. Then, the row decoder 52 outputs a decoded word line signal $\phi_s$ set to High, wherein a voltage of the decoded word line signal $\phi_s$ is $V_{cc}$. As a result, the NMOS 40 is ON, and a voltage of a node N5 is $V_{cc}-V_{th3}$, where $V_{th3}$ is a threshold voltage of the NMOS 40. Meanwhile, charges stored in the node N5 is about $(V_{cc}-V_{th3})(C_{gd}+C_{gs}+C_{\Phi N5})$, where $C_{\Phi N5}$ is a capacitance between the node N5 and the ground.

Then, the column decoder 54 outputs the word line signal $\phi Xi$ whose voltage is set to an amount such as $V_{pp}$; thus the NMOS 42 is ON and the NMOS 44 is OFF. Since the charges stored in the node N5 is about $(V_{cc}-V_{th3})(C_{gd}+C_{\angle N5}+C_{gs})$, a voltage $V_{N5}$ of the node N5 is about $((V_{pp}\times C_{gd})/(C_{gd}+C_{\Phi N5}+C_{gs}))+(V_{cc}-V_{th3})$, which is obtained by an equation $(V_{cc}-V_{th3})\times(C_{gd}+C_{\Phi N5}+C_{gs})=V_{N5}\times(C_{gd}+C_{\Phi N5}+C_{gs})+(V_{N5}-V_{pp})\times C_{gd}$. Because the capacitance $C_{gd}$ is larger than the capacitance $C_{gs}$ and the capacitance $C_{\Phi N5}$, the voltage $V_{N5}$ is actually about $V_{pp}+(V_{cc}-V_{th3})$. Therefore, the voltage $V_{N5}$ of the node N5 is boosted.

According to the foregoing, the advantages of the invention include the following:

1. The design of the voltage boosting circuit according to the invention is simple, and the voltage boosting circuit is all assembled from N-type metal oxide semiconductors. Furthermore, the N-type metal oxide semiconductors are fewer in number; thus an area occupied by the voltage boosting circuit is small.

2. By using the asymmetric MOS, the boosting ability of the voltage boosting circuit of the invention increases.

3. The manufacturing process of the asymmetric MOS according to the invention is compatible with the conventional process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage boosting circuit having an asymmetric metal oxide semiconductor, the circuit comprising:
   a first N-type metal oxide semiconductor, wherein a gate of the first N-type metal oxide semiconductor connects to a voltage source;
   an asymmetric N-type metal oxide semiconductor, wherein a gate of the asymmetric N-type metal oxide semiconductor connects to a drain region of the first N-type metal oxide semiconductor; and
   a second N-type metal oxide semiconductor, wherein a source region of the second N-type metal oxide semiconductor connects to a ground terminal and a drain region of the second N-type metal oxide semiconductor connects to a source region of the asymmetric N-type metal oxide semiconductor.

2. The circuit of claim 1, further comprising:
   a row decoder connecting to a drain region of the asymmetric N-type metal oxide semiconductor and a gate of the second metal oxide semiconductor;
   a column decoder connecting to a source region of the first N-type metal oxide semiconductor; and
   a word line connecting to a source region of the asymmetric N-type metal oxide semiconductor and a drain region of the second N-type metal oxide semiconductor.

3. The circuit of claim 1, wherein the drain region of the asymmetric N-type metal oxide semiconductor is wider than the source region of the same, and a portion of the drain region is covered by the gate.

4. A voltage boosting circuit having an asymmetric metal oxide semiconductor, the circuit comprising:
   a first N-type metal oxide semiconductor, wherein a gate of the first N-type metal oxide semiconductor connects to a voltage source and a source region of the first N-type metal oxide semiconductor connects to a row decoder;
   an asymmetric N-type metal oxide semiconductor whose drain region is wider than a source region of the same, wherein a gate of the asymmetric N-type metal oxide semiconductor connects to a drain region of the first N-type metal oxide semiconductor, the drain region of the asymmetric N-type metal oxide semiconductor connects to a column decoder, and the source region of the asymmetric N-type metal oxide semiconductor connects to a word line; and
   a second N-type metal oxide semiconductor, wherein a source region of the second N-type metal oxide semiconductor connects to a ground terminal, a drain region of the second N-type metal oxide semiconductor connects to a source region of the asymmetric N-type metal oxide semiconductor and a drain region of the second N-type metal oxide semiconductor connects to a source region of the asymmetric N-type metal oxide semiconductor.

5. The circuit of claim 4, wherein the drain region of the asymmetric N-type metal oxide semiconductor has a sufficient larger portion covered by the gate thereof compared to the source region of the same, so that the capacitance between the drain region and the gate is larger than that between the source region and the gate.

* * * * *